United States Patent [19]

Mortensen et al.

[11] Patent Number: 5,159,217
[45] Date of Patent: Oct. 27, 1992

[54] BROWNOUT AND POWER-UP RESET SIGNAL GENERATOR

[75] Inventors: Gordon L. Mortensen, San Jose; Neal L. Horovitz, Sunnyvale, both of Calif.

[73] Assignee: National Semiconductor Corporation, Santa Clara, Calif.

[21] Appl. No.: 737,160

[22] Filed: Jul. 29, 1991

[51] Int. Cl.⁵ .................. H03K 5/13; H03K 3/01; H03K 17/00; H02H 3/24
[52] U.S. Cl. ............................. 307/597; 307/601; 307/602; 307/603; 307/605; 307/269; 307/272.3; 328/60; 328/63; 328/72; 361/92
[58] Field of Search .......... 307/590, 595, 597, 601, 307/603, 605, 269, 130, 272.3; 361/384, 92; 340/663; 328/60, 63, 72

[56] References Cited

U.S. PATENT DOCUMENTS

| | | | |
|---|---|---|---|
| 4,862,142 | 8/1989 | Knight | 340/663 |
| 4,943,762 | 7/1990 | Campbell et al. | 323/276 |
| 4,985,804 | 1/1991 | Campbell et al. | 361/384 |
| 5,047,987 | 9/1991 | Kosuge | 340/663 |

OTHER PUBLICATIONS

ZILOG® Preliminary Product Specification for Z86C30 MOS Z8 8-Bit Microcontroller, Sep. 1989, pp. 1-33.

*Primary Examiner*—Stanley D. Miller
*Assistant Examiner*—Trong Phan
*Attorney, Agent, or Firm*—Limbach & Limbach

[57] ABSTRACT

A brownout reset generator includes a presettable counter and a reset controller consisting of a plurality of logic gates coupled to receive a brownout signal representing a power brownout condition or power assertion (i.e. power-up) and a clock signal, and to generate a brownout reset in response to and of selectively longer duration than the brownout signal. Following the leading edge of the brownout signal (i.e. initiation of the brownout condition), the counter is preset to a selected value and remains preset for the duration of the brownout signal. Following the trailing edge of the brownout signal (i.e. termination of the brownout condition), the counter begins counting clock pulses. The counter outputs a timing pulse after a selected number of clock pulses representing a predetermined time interval have been counted. The reset generator provides a brownout reset having a leading edge following and corresponding to the leading edge of the brownout signal and a trailing edge following and corresponding to the leading edge of the timing pulse. Thus, the brownout reset causes its user circuit (e.g. microprocessor) to remain in a brownout reset mode until after the predetermined time interval has passed following termination of the brownout condition. This allows sufficient time for the user circuit's operating parameters to stabilize (e.g. crystal clock signal) or initialize (e.g. internal registers and address pointers) properly prior to resuming operation following termination of the brownout condition.

36 Claims, 7 Drawing Sheets

BROWNOUT AND POWER-UP RESET SIGNAL GENERATOR

BACKGROUND OF THE INVENTION

1. Field of the Invention

The present invention relates to digital reset signal generator circuits, and in particular, to digital brownout reset signal generator circuits for resetting digital circuits under power brownout conditions.

2. Description of the Related Art

Most digital systems, such as microprocessors or microcontrollers, include a means by which they can be reset under various, specific conditions. For example, it is typically desirable to reset a microprocessor upon power up, i.e. initial application of DC power, to delay operation of the microprocessor until its associated clock circuitry has started running and becomes stabilized and the processor has initialized its internal registers, memory address pointers and external connections (e.g. tri-state outputs) to predetermined states (e.g. logical high or low, or "tri-state"). Another situation in which a reset is typically desired is under brownout conditions, i.e. when DC voltage to the microprocessor has fallen below a minimum value deemed sufficient for reliable operation.

The means by which microprocessors are typically reset under power up or brownout conditions involves an externally accessible connection, e.g. a reset pin, for delivering a reset signal to the microprocessor. This is typically done by driving the reset pin to a logical zero for a period of time long enough to ensure that the microprocessor is reset and its clock is running. This is usually accomplished using an external resistor-capacitor network connected to the reset pin. Other techniques involve the use of a timer circuit such as a monostable multivibrator ("one-shot").

A number of problems are associated with these reset techniques. The use of external components, such as discrete resistors and capacitors, introduce added expense and require a relatively large amount of space, due to their physical sizes, as compared to that required by a microprocessor integrated circuit. Precise or consistent time delays or durations for the reset signal can be difficult to achieve due to individual component performance tolerances of the discrete external components or integrated circuits. Varying the time delays or durations for the reset signal requires the physical replacement of at least one of the discrete external components. Further, such "dumb" resetting, i.e. with no knowledge of the true status of the clock signal, can allow the microprocessor to exit reset and begin operation with a faulty or non-existent clock signal.

SUMMARY OF THE INVENTION

A brownout reset generator in accordance with the present invention receives a brownout signal representing a power brownout or power-up condition, receives a clock signal, and generates in response to and at a selected time interval after a first portion of the brownout signal a reset delay timing signal. A brownout reset is provided having a leading edge responsive to the first portion of the brownout signal and having a trailing edge responsive to a portion of the reset delay timing signal. In one preferred embodiment of the present invention, the reset delay timing signal, and therefore the trailing edge of the brownout reset, are generated only after a predetermined number of clock pulses have been received and counted.

Therefore, the time interval defining the brownout reset condition can be selectively defined according to the predetermined number of clock pulses which must be counted prior to terminating the brownout reset. This prevents a user circuit (e.g. a microprocessor) from exiting reset and entering its operational state with a faulty or non-existent clock signal. Alternatively, the time interval defining the brownout reset condition equals that of the originally received brownout signal, where clock pulses are not counted and the brownout reset follows the originally received brownout signal.

These and other features and advantages of the present invention will be understood upon consideration of the following detailed description of the invention and the accompanying drawings.

DETAILED DESCRIPTION OF THE INVENTION

Throughout the figures and the following discussion, various digital signals are illustrated and discussed in terms of positive logic, i.e. where a logical one, or "true" signal is represented by a higher magnitude or level of signal than a logical zero, or "false" signal. However, it should be understood that the use of negative logic can be substituted for providing appropriate signal inversions. Further, throughout the following discussion, the term leading edge is used to refer to that portion of a signal representing the transition from a logical zero to logical one state, and the term trailing edge is used to refer to that portion of a signal representing its transition from a logical one to a logical zero state.

Figure 1:
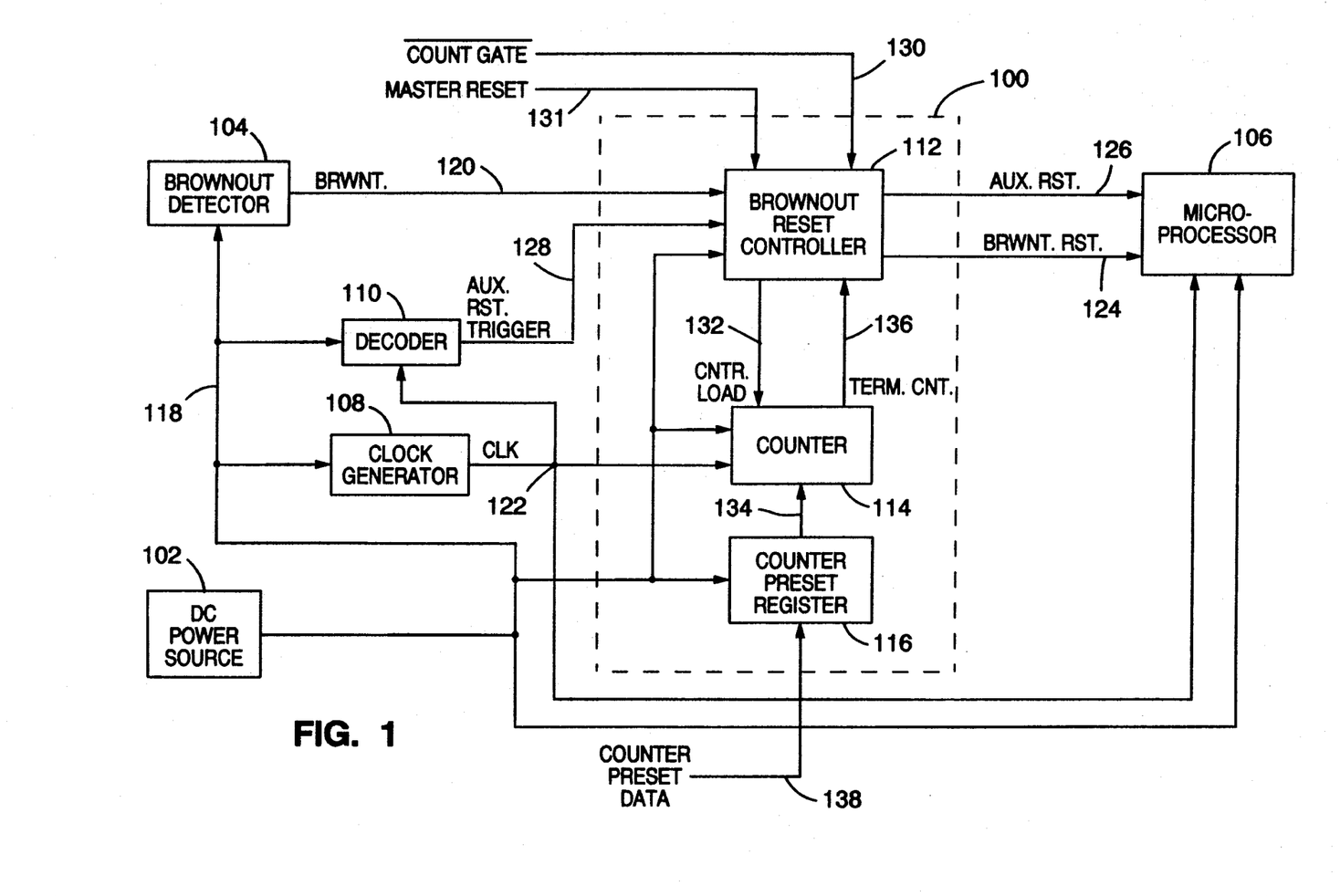
FIG. 1 is a functional block diagram of a brownout reset network for a microprocessor using a brownout reset generator in accordance with the present invention.

Referring to FIG. 1, a brownout reset network using a brownout reset generator 100 in accordance with the present invention includes: the brownout reset generator 100; a DC power source 102; a brownout detector 104; a microprocessor 106; a clock generator 108; and a decoder 110, interconnected substantially as shown. In turn, in accordance with the present invention, the brownout reset generator 100 includes a brownout reset controller 112, a counter 114 and a counter preset register 116, interconnected substantially as shown.

The DC power source 102 provides DC power via a DC power line 118 coupled to the foregoing elements. The brownout detector 104 monitors the voltage of the DC power line 118. When a brownout condition occurs (an asynchronous event), i.e. when the line voltage of the DC power line 118 falls below a predetermined value, the brownout detector 104 provides a brownout signal 120 to the brownout reset generator 100 (discussed more fully below). A brownout detector used with a preferred embodiment of the present invention is the subject of a commonly assigned, copending U.S. patent application Ser. No. 07/695,487, entitled "Noise Resistant Low Voltage Brownout Detector With Shut Off Option" and filed by Hall and Dubowski on May 3, 1991. The specification of the foregoing patent application is incorporated herein by reference.

The clock generator 108 provides a clock signal 122 for the brownout reset generator 100 (i.e. for the counter 114), the microprocessor 106 and the decoder 110. The decoder 110 selectively decodes the clock signal 122 to produce an auxiliary reset trigger signal 128 for the brownout reset generator 100 (i.e. for the brownout reset controller 112). The microprocessor 106 further receives a brownout reset 124 and auxiliary reset 126 (discussed more fully below). The brownout reset 124 is used by the microprocessor 106 for most of its internal reset functions, while the auxiliary reset 126 can be used as desired for other microprocessor reset functions, including but not limited to synchronization.

Within the brownout reset generator 100 (discussed more fully below), the brownout reset controller 112 receives the brownout signal 120 from the brownout detector 104 and a count gate signal (active low) 130 (discussed more fully below), and generates therefrom a counter load signal 132 for the counter 114. The counter 114 receives the clock signal 122 and the counter load signal 132, and in accordance with counter preset data 134 from the counter preset register 116, the counter 114 produces a terminal count signal 136. Responsive to the brownout signal 120, auxiliary reset trigger signal 128 and terminal count signal 136, the brownout reset controller 112 produces the brownout reset 124 and auxiliary reset 126.

The count gate 130 (active low) and master reset 131 signals are received by the brownout reset generator 100 from an external source (not shown). The counter preset data 134 received by the counter 114 from the counter preset register 116 is initially inputted thereto for storage via a counter preset data signal 138 received from an external source (not shown).

The count gate signal (active low) 130 is selectively activated via the external source when the brownout reset described below is desired, e.g. when a delayed exit from a brownout reset mode is desired to allow stabilization of the clock generator 108. The master reset signal 131 is selectively activated via the external source when it is desired to asynchronously reset the brownout reset generator 100 and the microprocessor 106, provided the brownout signal 120 is inactive, i.e. in a logical low state.

The decoder 110 can be configured as desired to receive and decode the clock signal 122 to produce the auxiliary reset trigger signal 128. For example, the decoder 110 can be designed to produce an auxiliary reset trigger signal 128 having virtually any desired timing relationship with respect to the brownout reset 124 to produce a desired auxiliary reset 126 (discussed further below). In a preferred embodiment, the auxiliary reset trigger signal 128 has pulsewidths equal to two pulses 123 of the clock signal 122 (discussed further below for FIG. 3) with leading and trailing edges coincident with the leading edges of such two clock pulses 123.

Figure 2A:
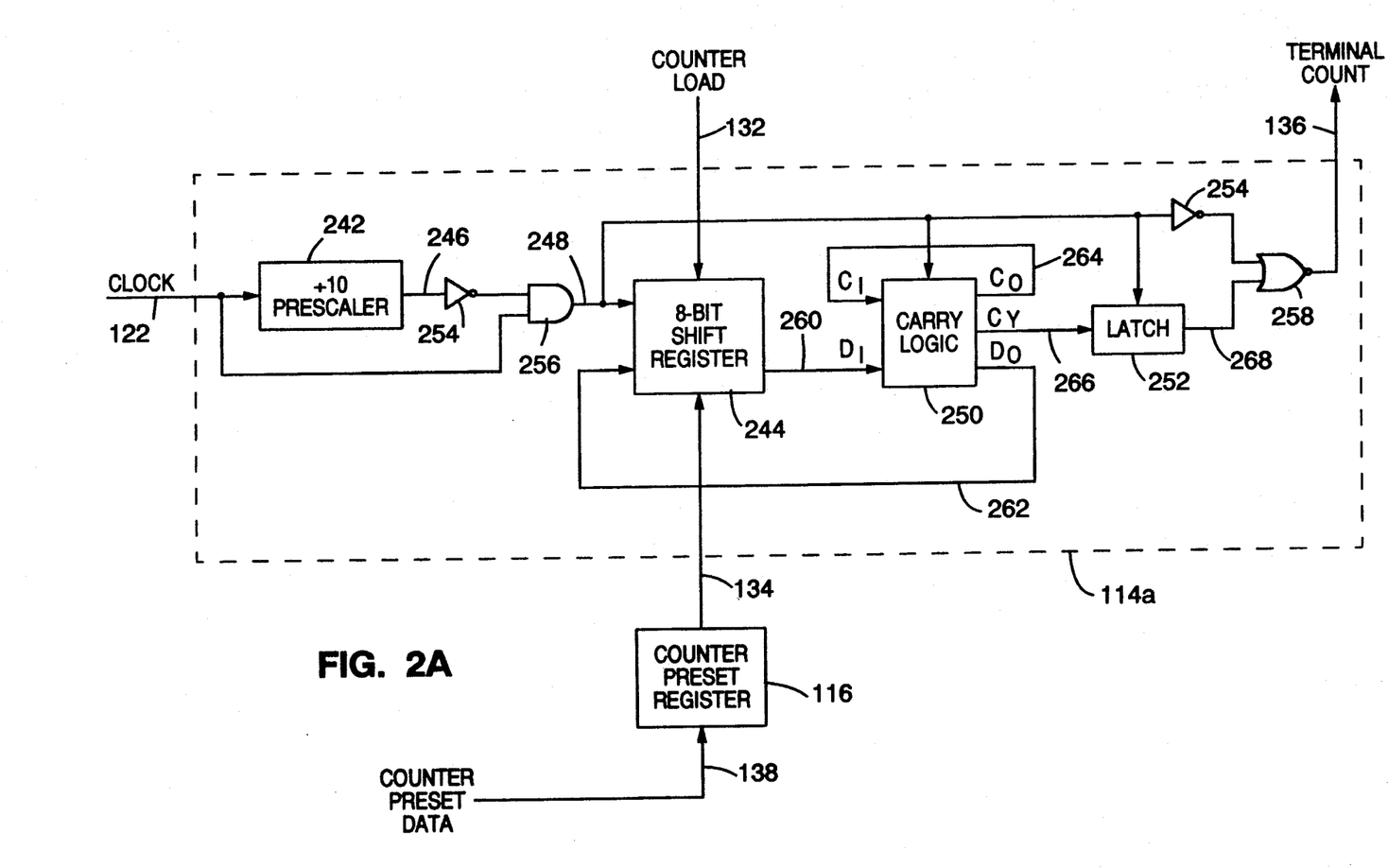
FIG. 2A is a functional block diagram of a preferred embodiment of the counter of FIG. 1.

Referring to FIG. 2A, a preferred embodiment of the present invention uses a presettable, serial-shifting synchronous down-counter 114a which includes: a divide-by-10 prescaler 242; an 8-bit shift register 244; carry logic 250; a latch 252; inverters 254; an AND gate 256; and a NOR gate 258, all connected substantially as shown. The counter preset register 116 is preferably a parallel data register or latch, many types of which are known in the art.

Figure 3:
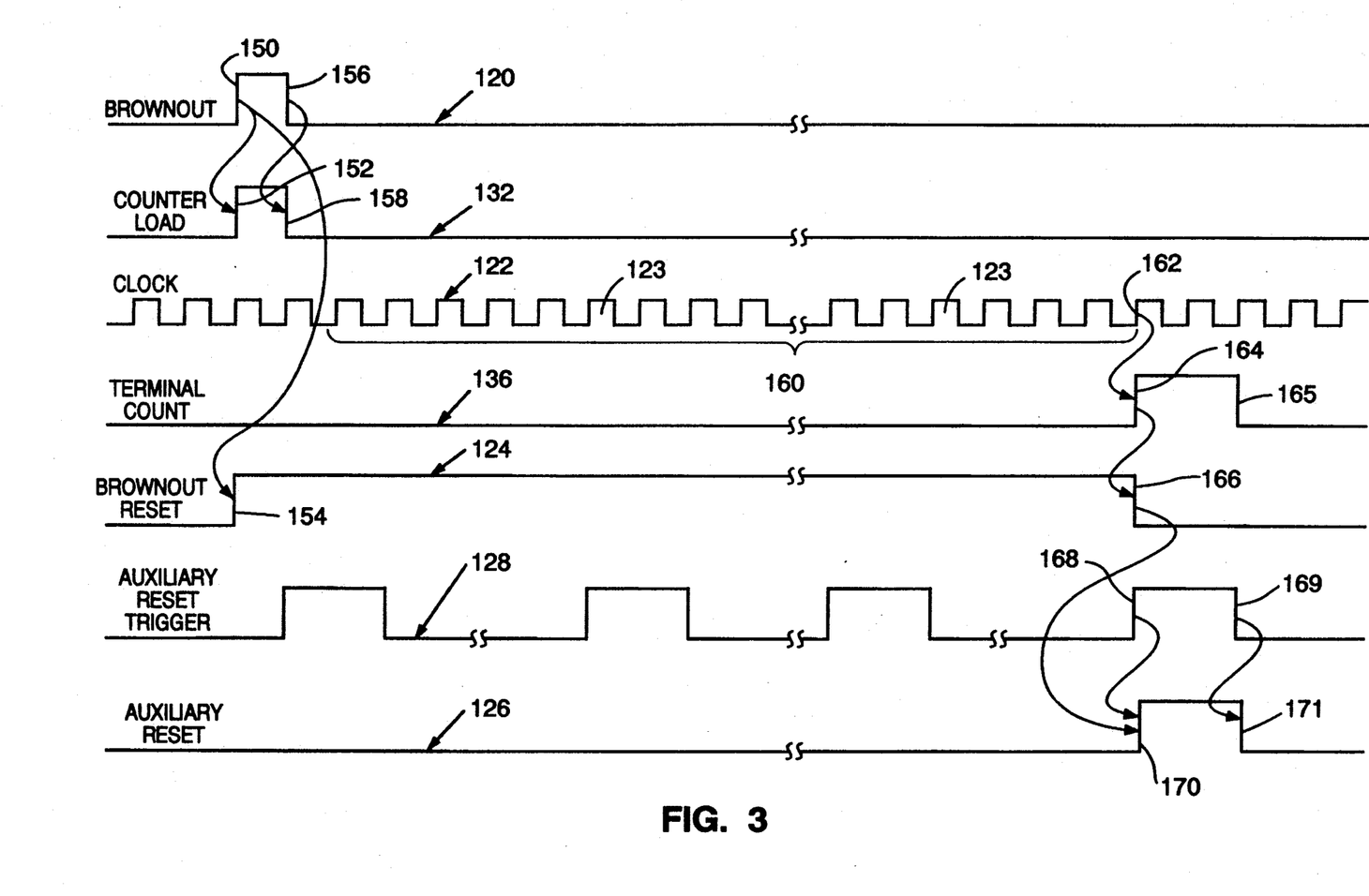
FIG. 3 is a timing diagram of a plurality of signals associated with the brownout reset generator of FIG. 1.

The prescaler 242 receives the clock signal 122 and prescales, i.e. divides, it by ten to produce a prescaled clock signal 246. The prescaler 242 should be of the type known in the art which produces a nonsymmetrical prescaled clock signal 246 having an active pulse width equal to two clock pulses 123 (FIG. 3). The prescaled clock signal 246 is inverted and then "AND-ed" with the original clock signal 122 to provide a shift clock signal 248 to the 8-bit shift register 244, carry logic 250 and latch 252.

In a preferred embodiment of the present invention, the 8-bit shift register 244 is initially preset to "FF" (hexadecimal) in accordance with counter preset data 134 received from the counter preset register 116 and the counter load signal 132 (as discussed above). Thereafter, in accordance with its shift clock signal 248, the shift register 244 shifts its data to the right, producing a data input signal "$D_I$" 260 for the carry logic 250. In turn, the carry logic 250 produces a data output signal "$D_o$" 262 (which is routed back as an shift data input signal for the shift register 244 for further shifting), an interim carry output signal "$C_o$" 264, and a final carry output signal "$C_Y$" 266. The interim carry output signal "$C_o$" 264 is used by the carry logic 250 as a carry input signal "$C_I$". The carry logic 250 produces the foregoing signals according to the following Boolean functions:

$$C_o = C_I \cdot \overline{D}_I$$

$$D_o = D_I \oplus C_I$$

$$C_Y = C_{I(t+1)}$$

where: $C_{I(t+1)}$ = state of carry input signal $C_I$ following the next shift clock 248 cycle.

The final carry output signal "$C_Y$" 266 is captured by the latch 252 in accordance with the shift clock signal 248, and becomes available as a latched data signal 268. This latched data signal 268 is "NOR-ed" with the inverse of the shift clock signal 248 to produce the terminal count signal 136. Thus, in accordance with the foregoing, the presettable, serial-shifting synchronous counter 114a produces a terminal count signal 136 having one pulse for every 2560 input pulses 123 of the clock signal 122 (FIG. 3).

It should be understood that the 8-bit shift register 244 can be initially preset to values other than "FF." For example, the 8-bit shift register 244 can be preset to "9D" (hexadecimal), in which case, a terminal count signal 136 is produced having one pulse for every 1580 input clock pulses 123 of the clock signal 122. Further, the shift register 244 can be other than an 8-bit shift register (e.g. 4 or 16 bits).

Figure 2B:
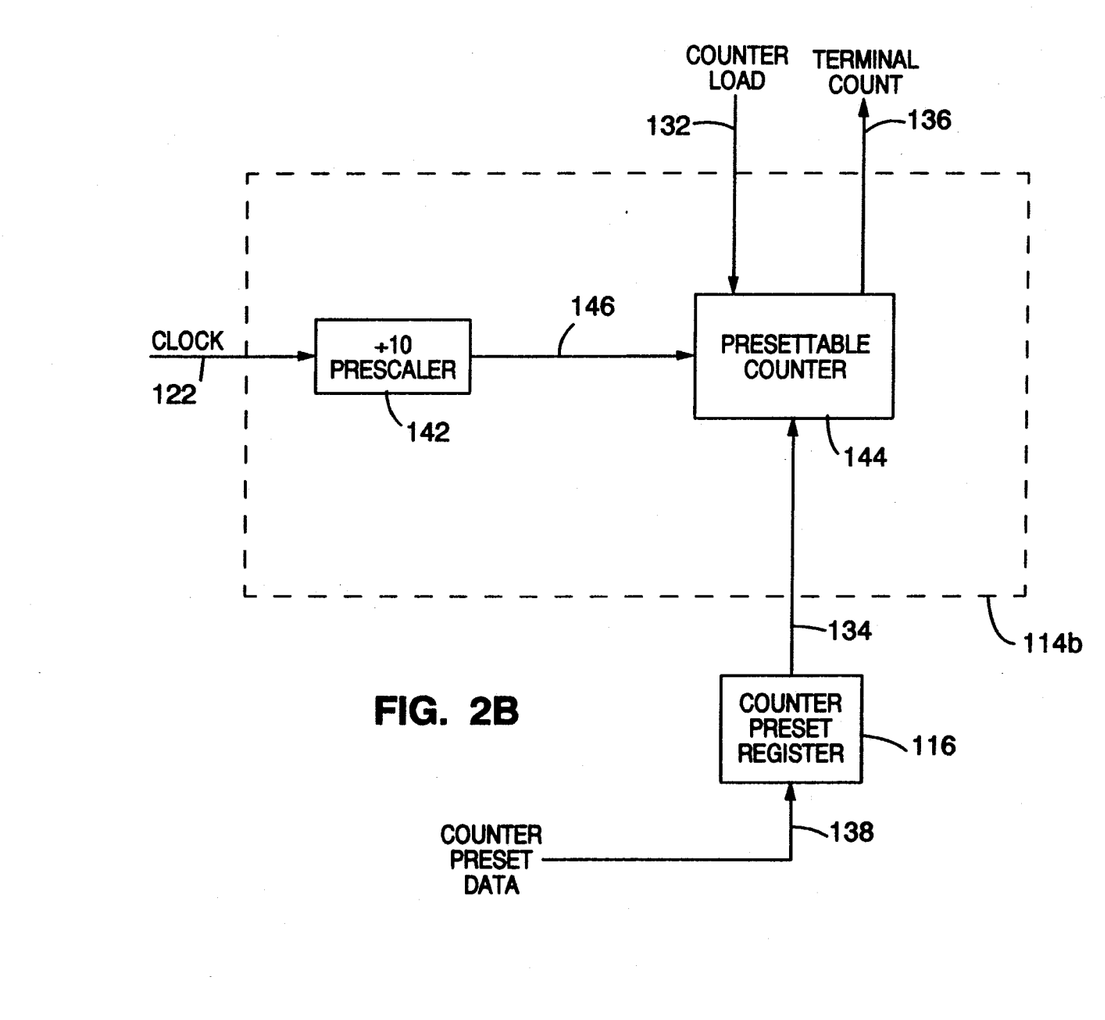
FIG. 2B is a functional block diagram of an alternative embodiment of the counter of FIG. 1.

Referring to FIG. 2B, an alternative embodiment of the present invention uses a counter 114b consisting of a divide-by-10 prescaler 142 and a presettable counter 144, many types of both of which are known in the art. The counter preset register 116 is preferably a parallel data register or latch, many types of which are known in the art.

The prescaler 142 receives the clock signal 122 and prescales, i.e. divides, it by ten to produce a prescaled clock signal 146. The presettable counter 144, in accordance with counter preset data 134 received from the counter preset register 116 (as discussed above), counts the prescaled clock signal 146. Upon reaching terminal count, the presettable counter 144 provides the terminal count signal 136. In this embodiment of the present invention, the presettable counter 144 is an 8-bit downcounter which is initially preset, e.g. to "FF" (hexadecimal). Therefore, with the divide-by-10 prescaling by the prescaler 142 and the divide-by-256 by the 8-bit presettable counter 144, the terminal count signal 136 produces one pulse for every 2560 input pulses 123 of the clock signal 122.

Referring to FIG. 3, the timing relationships of the input 120, 122, 128, internal 132, 136, and output 124, 126 signals of the brownout reset generator 100 can be better understood. The leading edge 150 of the brownout signal 120 is responsible for producing the leading edges 152, 154 of the counter load signal 132 and brownout reset 124. The trailing edge 156 of the brownout signal 120 is responsible for producing the trailing edge 158 of the counter load signal 132.

Following the trailing edge 158 of the counter load signal 132, the counter 114 (FIG. 1) begins counting the incoming pulses 123 of the clock signal 122. After a selected plurality 160 of clock pulses have been counted by the counter 114, the leading edge 162 of the last counted clock pulse is responsible for producing the leading edge 164 of the terminal count signal 136 from the counter 114. In turn, the leading edge 164 of the terminal count signal 136 is responsible for producing the trailing edge 166 of the brownout reset 124. Thus, the terminal count signal 136 serves as a reset delay timing signal for timing the termination of the brownout reset 124.

Coincidence of the trailing edge 166 of the brownout reset 124 and the leading edge 168 of the auxiliary reset trigger 128 produces the leading edge 170 of the auxiliary reset 126. The trailing edge 169 of the auxiliary reset trigger 128 (two clock pulses 123 long and coincident with the trailing edge 165 of the terminal count signal 136 as discussed above) produces the trailing edge 171 of the auxiliary reset 126.

The foregoing discussion for the timing diagram of FIG. 3 is accurate when the count gate signal (active low) 130 is in its logical zero state and the master reset signal 131 is in its logical one state. If the count gate signal (active low) 130 is brought to a logical one state, the counter load signal 130 remains in a logical zero state, thereby preventing loading of the counter 114 (FIG. 1). Further, with the count gate signal (active low) 130 in a logical one state, the brownout reset 124 has leading 154 and trailing 166 edges coincident with the leading 150 and trailing 156 edges, respectively, of the brownout signal 120.

If the brownout signal 120 is inactive, i.e. at a logical zero, and the master reset signal 131 is brought to its active state, i.e. a logical one, it forces the trailing edge 166 of the brownout reset 124, thereby rendering the brownout reset 124 inactive, and the counter 114 is loaded, e.g. with FF (hexadecimal); therefore, operation of the microprocessor 106 is controlled by the master reset signal 131. However, if the brownout signal 120 is active, i.e. at a logical one, the state of the master reset signal 131 has no effect.

Figure 4:
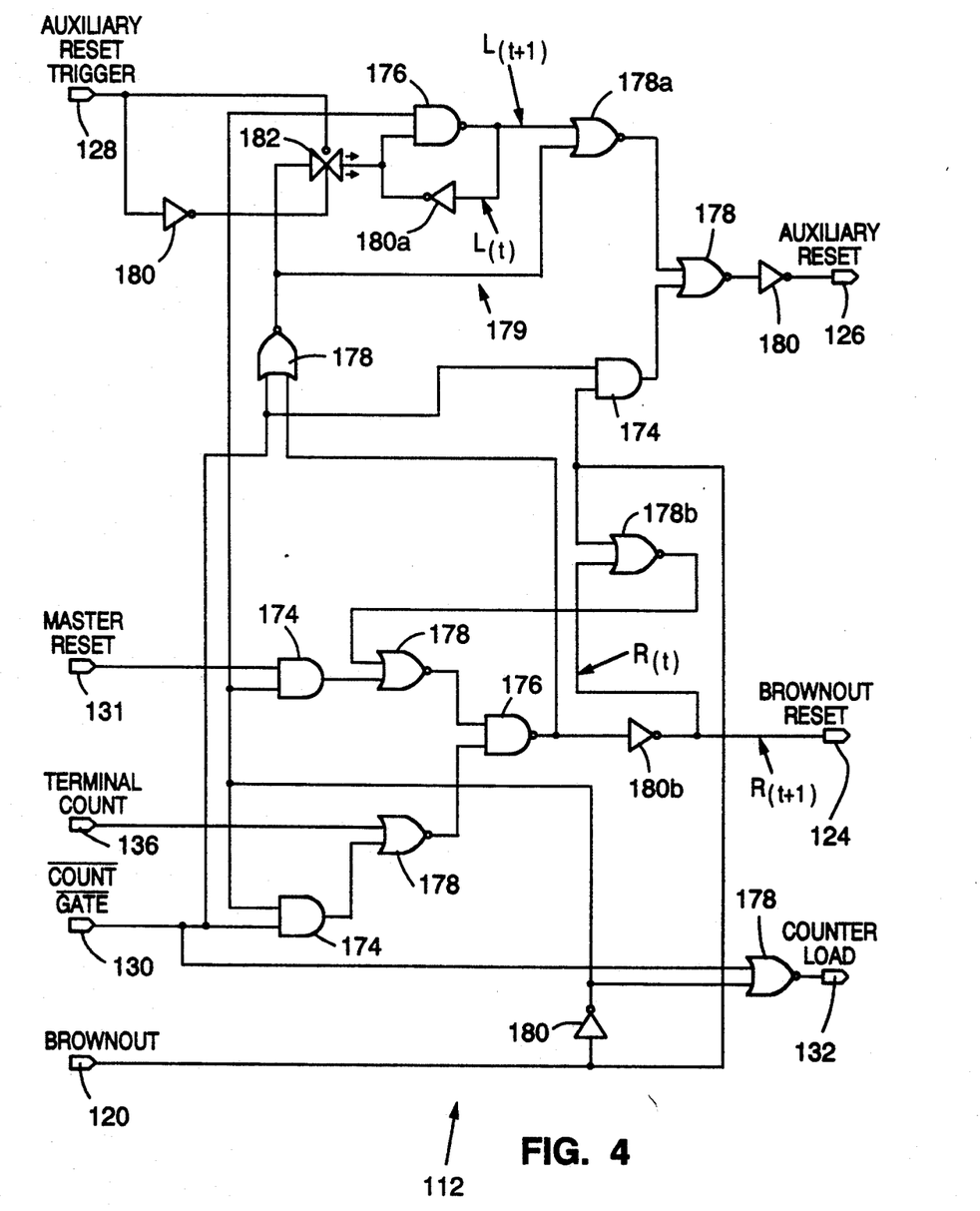
FIG. 4 is a logic diagram of the brownout reset controller of FIG. 1.

Referring to FIG. 4, a preferred embodiment of the brownout reset controller 112 of FIG. 1 includes pluralities of AND gates 174, NAND gates 176, NOR gates 178, 178a, 178b and inverters 180, 180a, 180b, and a pass gate 182, coupled substantially as shown. These logic elements 174, 176, 178, 178a, 178b, 180, 180a, 180b, 182 are coupled to produce the output signals 124, 126, 132 from the input signals 120, 128, 130, 131, 136 as discussed above substantially in accordance with the following Boolean functions:

$$R_{(t+1)} = (B + R_{(t)} \cdot \overline{M} \cdot G) \cdot \overline{T}$$

$$A = G \cdot B + \overline{G \cdot R + L_{(t+1)}}$$

$$C = G \cdot B$$

where:
$$L_{(t+1)} = B + (\overline{L_r E + G \cdot R \cdot \overline{E}})$$

$R_{(x)}$ = state of brownout reset at time X
$A$ = auxiliary reset
$C$ = counter load signal
$L_{(x)}$ = logic preload state at time X
$B$ = brownout signal
$T$ = terminal count signal
$M$ = master reset signal
$G$ = count gate signal
$E$ = auxiliary reset trigger signal.

The brownout reset states $R_{(t)}$ and $R_{(t+1)}$ represent temporarily adjacent, preloaded logic states of the brownout reset 124 which is also the signal at the node formed by the junction of one of the inputs of a NOR gate 178b and the output of an inverter 180b in the brownout reset controller 112. Conceptually, the initial brownout reset state $R_{(t)}$ can be thought of as the state of one of the inputs to the NOR gate 178b at a present time "t," and the subsequent brownout reset state $R_{(t+1)}$ can be thought of as the state of the output of the inverter 180b at a subsequent time "t+1." As indicated in the above expression, the subsequent state $R_{(t+1)}$ of the brownout reset is dependent upon the present state $R_{(t)}$ of the brownout reset, and is used as the outputted brownout reset 124.

The logic preloads $L_{(t)}$ and $L_{(t+1)}$ represent temporarily adjacent, preloaded logic states of the signal at the node formed by the junction of one of the inputs of a NOR gate 178a and the input of an inverter 180a forming part of a latch circuit 179 in the brownout reset controller 112. Conceptually, the initial logic preload state $L_{(t)}$ can be thought of as the state of the input to the inverter 180a at a present time "t," and the subsequent logic preload state $L_{(t+1)}$ can be thought of as the state of one of the inputs to the NOR gate 178a at a subsequent time "t+1." As indicated in the above expression, the subsequent state $L_{(t+1)}$ of the logic preload is dependent upon the present state $L_{(t)}$ of the logic preload, and is used to produce the auxiliary reset 126

The count gate signal (active low) 130 can be used as an enabling type of signal for when the clock generator 108 (FIG. 1) uses a crystal oscillator (not shown) and it is desired to delay the occurrence of the end, i.e. the trailing edge 166, of the brownout reset 124 (FIG. 3) to allow the crystal oscillator to stabilize. With the count gate signal (active low) 130 active, i.e. at a logical zero, the brownout reset controller 112 functions according to the foregoing discussion. However, if the clock generator 108 does not use a crystal oscillator, or if it is not desired to delay the end of the brownout reset 124, the count gate signal (active low) 130 can be made inactive, i.e. set to a logical one state. As discussed above, this causes the counter load signal 132 to remain in a logical zero state and the brownout reset 124 simply follows, i.e. is coincident with, the input brownout signal 120.

Figure 5:
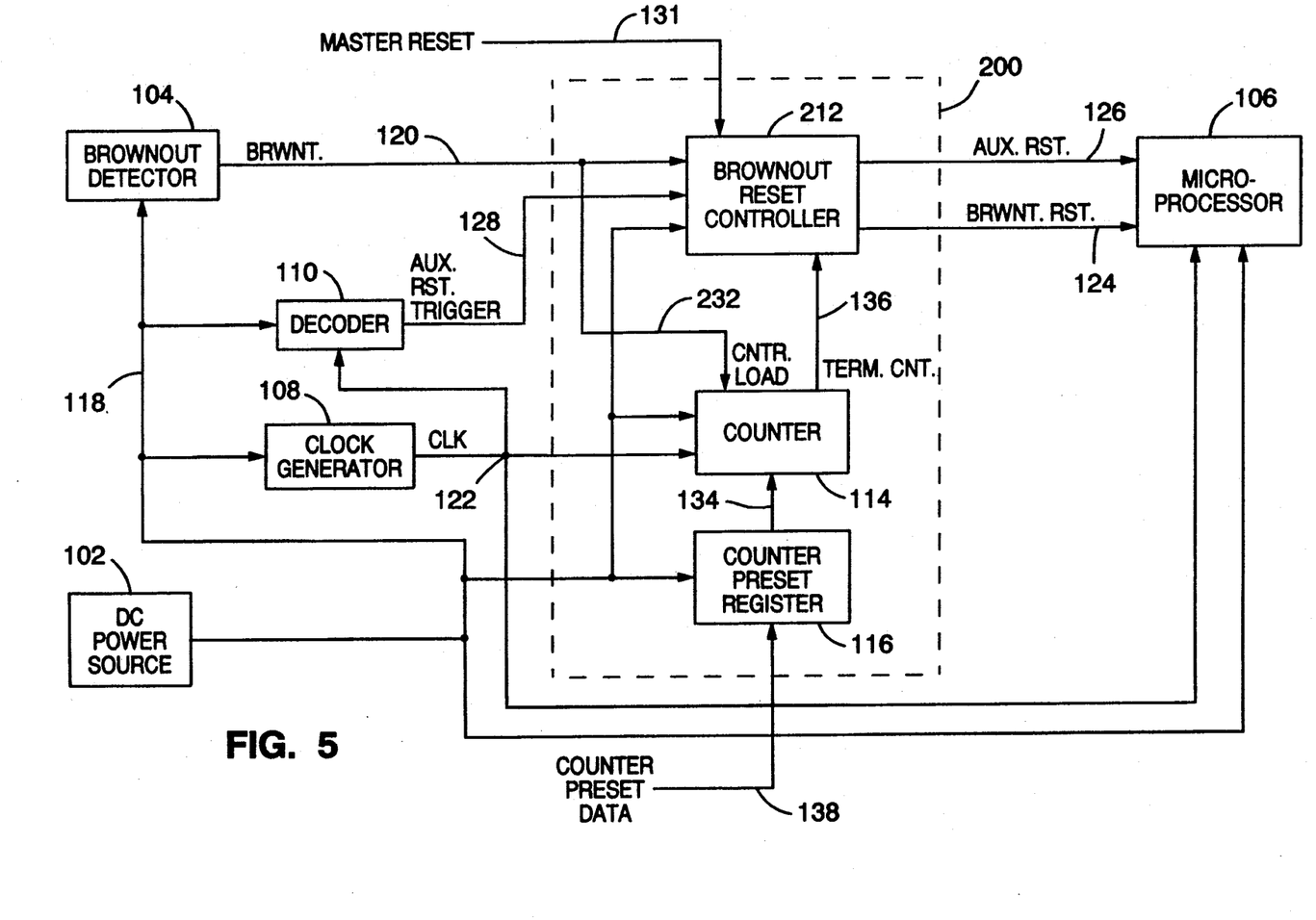
FIG. 5 is a functional block diagram of a brownout reset network for a microprocessor using an alternative embodiment of a brownout reset generator in accordance with the present invention.

Referring to FIG. 5, an alternative brownout reset network uses an alternative embodiment of a brownout reset generator 200 in accordance with the present invention. This alternative embodiment of the brownout reset generator 200 uses the same counter 114 and counter preset register 116 as discussed above. However, the brownout reset controller 212 of FIG. 5 differs from the brownout reset controller 112 of FIG. 1.

This alternative brownout reset controller 212 receives the brownout signal 120, auxiliary reset trigger signal 128 and terminal count signal 136, and produces the brownout reset 124 and auxiliary reset 126 in accordance with the foregoing discussion. However, this alternative brownout reset controller 212 does not produce a counter load signal for the counter 114. Instead, the counter load signal 232 is provided directly by the brownout signal 120. Therefore, no count gate signal (active low) 130 (FIG. 1) is needed.

Figure 6:
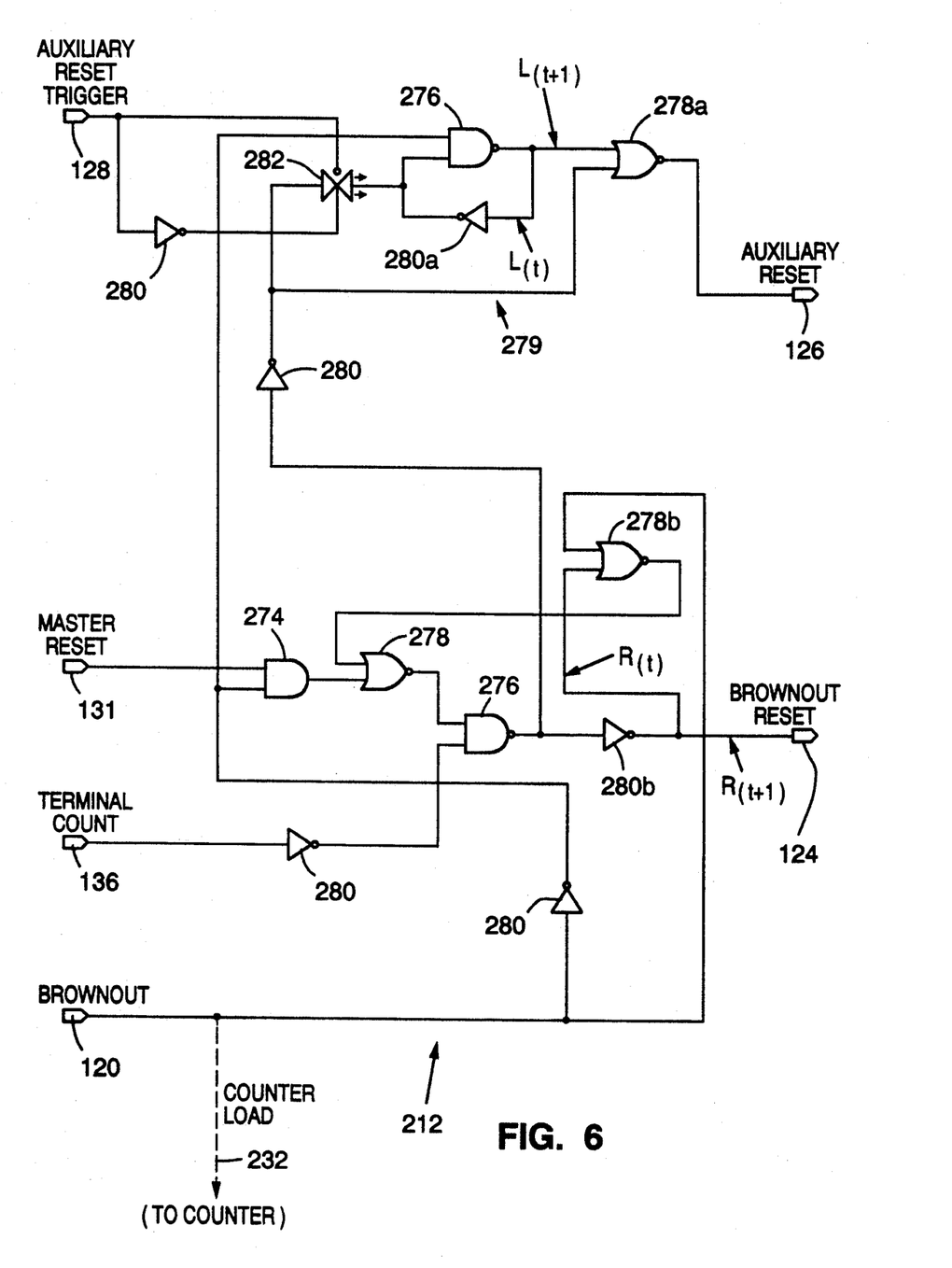
FIG. 6 is a logic diagram of the brownout reset controller of FIG. 5.

Referring to FIG. 6, the alternative preferred embodiment of the brownout reset controller 212 of FIG. 5 includes an AND gate 274, a plurality of NAND gates 276, NOR gates 278, 278a, 278b and inverters 280, 280a, 280b, and a pass gate 282, coupled substantially as shown. This alternative brownout reset controller 212 receives its input signals 120, 128, 131, 136 and produces its output signals 124, 126 as discussed above substantially in accordance with the following Boolean functions:

$$R_{(t+1)} = (B + R_{(t)} \cdot \overline{M}) \cdot \overline{T}$$

$$A = \overline{R + L_{(t+1)}}$$

where: $L_{(t+1)} = B + (\overline{L_t \cdot E + R \cdot E})$

Since termination of a power brownout condition is functionally equivalent to the initiation of a power-up condition, it should be understood from the foregoing that a brownout reset generator 100 (FIG. 1), 200 (FIG. 5) in accordance with the present invention can be operated as a power-up reset generator, where the input signal 120 is a power-up signal representing a power-up condition rather than a brownout signal representing a power brownout condition. In response to the initiation of power assertion, such a power-up signal 120 would have a leading edge 150 (FIG. 3) similar to that for the brownout signal 120 discussed above. Following that, in response to the termination of power assertion due to the initiation of a power-up condition, i.e. that point where the line voltage of the DC power line 118 (FIG. 1) rises above a predetermined value, such a power-up signal 120 would have a trailing edge 156 similar to those for the brownout signal 120. Functionally, the remaining signals and circuit operation would be as described above, with merely the interpretation of the input signal 120 being slightly different.

Various other modification and alterations in the structure and method of operation of this invention will be apparent to those skilled in the art without departing from the scope and spirit of this invention. Although the invention has been described in connection with specific preferred embodiments, it should be understood that various alternatives to those embodiments can be employed in practicing the present invention. It is intended that the following claims define the scope of the present invention, and that structures and methods within the scope of these claims and their equivalents be covered thereby.

What is claimed is:

1. A brownout reset signal generator for generating a brownout reset signal in response to a brownout signal representing a power brownout condition, wherein said brownout reset signal terminates after a selected time interval subsequent to termination of said brownout condition, said brownout reset signal generator comprising:

reset delay timer means for receiving a brownout signal representing a power brownout condition and for generating a reset delay timing signal in response to and at a selected time interval after a first portion of said received brownout signal; and reset generator means connected to said reset delay timer means for receiving said reset delay timing signal, for receiving said brownout signal, and for generating a brownout reset signal having a leading edge responsive to said first portion of said received brownout signal and having a trailing edge responsive to a second portion of said received reset delay timing signal.

2. A brownout reset signal generator as recited in claim 1, wherein said reset delay timer means further receives a clock signal comprising a plurality of clock pulses and generates said reset delay timing signal in response to a selected number of said plurality of clock pulses corresponding to said selected time interval.

3. A brownout reset signal generator as recited in claim 1, wherein said reset delay timer means comprises a counter.

4. A brownout reset signal generator as recited in claim 2, wherein said reset delay timer means comprises a presettable counter.

5. A brownout reset signal generator as recited in claim 1, wherein said reset generator means comprises a plurality of logic gates interconnected to receive said reset delay timing signal, receive said brownout signal and generate said brownout reset signal.

6. A brownout reset signal generator as recited in claim 1, wherein said reset generator means generates said brownout reset signal substantially in accordance with the Boolean function:

$$R_{(t+1)} = (B + R_{(t)}) \cdot \overline{T}$$

where:
$R_{(t)}$ = present state of said brownout reset signal
$R_{(t+1)}$ = next state of said brownout reset signal
B = said received brownout signal
T = said reset delay timing signal.

7. A brownout reset signal generator for generating a brownout reset signal in response to a brownout signal representing a power brownout condition, wherein said brownout reset signal selectively terminates after a selected time interval subsequent to termination of said brownout condition, said brownout reset signal generator comprising:

gating means for receiving a gating signal, for receiving a brownout signal representing a power brownout condition, and for selectively gating said received brownout signal in accordance with said received gating signal;

reset delay timer means connected to said gating means for receiving said selectively gated brownout signal and for generating a reset delay timing signal in response to and at a selected time interval after a first portion of said received, selectively gated brownout signal; and reset generator means connected to said reset delay timer means for receiving said reset delay timing signal, for receiving said brownout signal, for receiving said gating signal, and for generating a brownout reset signal, wherein said brownout reset signal includes a leading edge responsive to said received gating signal and said first portion of said received brownout signal, and further includes a trailing edge responsive to said received gating signal and a second portion of said received reset delay timing signal.

8. A brownout reset signal generator as recited in claim 7, wherein said reset delay timer means further receives a clock signal comprising a plurality of clock pulses and selectively generates said reset delay timing signal in response to a selected number of said plurality of clock pulses corresponding to said selected time interval.

9. A brownout reset signal generator as recited in claim 7, wherein said reset delay timer means comprises a counter.

10. A brownout reset signal generator as recited in claim 8, wherein said reset delay timer means comprises a presettable counter.

11. A brownout reset signal generator as recited in claim 7, wherein said reset generator means comprises a plurality of logic gates interconnected to receive said reset delay timing signal, receive said brownout signal, receive said gating signal, and generate said brownout reset signal 12. A brownout reset signal generator as recited in claim 7, wherein said reset generator means generates said brownout reset signal substantially in accordance with the Boolean function:

$$R_{(t+1)} = (B + R_{(t)} \cdot G) \cdot \overline{T}$$

where:
$R_{(t)}$ = present state of said brownout reset signal
$R_{(t+1)}$ = next state of said brownout reset signal
B = said received brownout signal
T = said reset delay timing signal
G = said received gating signal.

13. A brownout reset signal generation method for generating a brownout reset signal in response to a brownout signal representing a power brownout condition, wherein said brownout reset signal is terminated after a selected time interval subsequent to termination of said brownout condition, said brownout reset signal generation method comprising the steps of:

receiving a brownout signal representing a power brownout condition;

generating a reset delay timing signal in response to and at a selected time interval after a first portion of said received brownout signal; and generating a brownout reset signal having a leading edge responsive to said first portion of said received brownout signal and having a trailing edge responsive to a second portion of said reset delay timing signal.

14. A brownout reset signal generation method as recited in claim 13, further comprising the steps of receiving a clock signal having a plurality of clock pulses and generating said reset delay timing signal in response to a selected number of said plurality of clock pulses corresponding to said selected time interval.

15. A brownout reset signal generation method as recited in claim 13, wherein said step of generating said brownout reset signal is substantially in accordance with the Boolean function:

$$R_{(t+1)} = (B + R_{(t)}) \cdot \overline{T}$$

where:
$R_{(t)}$ = present state of said brownout reset signal
$R_{(t+1)}$ = next state of said brownout reset signal
B = said received brownout signal
T = said reset delay timing signal.

16. A brownout reset signal generation method for generating a brownout reset signal in response to a brownout signal representing a power brownout condition, wherein said brownout reset signal is selectively terminated after a selected time interval subsequent to termination of said brownout condition, said brownout reset signal generation method comprising the steps of:

receiving a brownout signal representing a power brownout condition;

receiving a gating signal;

selectively gating said received brownout signal in accordance with said received gating signal;

generating a reset delay timing signal in response to and at a selected time interval after a first portion of said selectively gated brownout signal; and generating a brownout reset signal having a leading edge responsive to said received gating signal and said first portion of said received brownout signal, and further having a trailing edge responsive to said received gating signal and a second portion of said reset delay timing signal.

17. A brownout reset signal generation method as recited in claim 16, further comprising the steps of receiving a clock signal having a plurality of clock pulses and selectively generating said reset delay timing signal in response to a selected number of said plurality of clock pulses corresponding to said selected time interval.

18. A brownout reset signal generation method as recited in claim 16, wherein said step of generating said brownout reset signal is substantially in accordance with the Boolean function:

$$R_{(t+1)} = (B + R_{(t)} \cdot G) \cdot \overline{T}$$

where:
$R_{(t)}$ = present state of said brownout reset signal
$R_{(t+1)}$ = next state of said brownout reset signal
B = said received brownout signal
T = said reset delay timing signal
G = said received gating signal.

19. A power-up reset signal generator for generating a power-up reset signal in response to a power-up signal representing a power-up condition, wherein said power-up reset signal terminates after a selected time interval subsequent to initiation of said power-up condition, said power-up reset signal generator comprising:

reset delay timer means for receiving a power-up signal representing a power-up condition and for generating a reset delay timing signal in response to and at a selected time interval after a first portion of said received power-up signal; and reset generator means connected to said reset delay timer means for receiving said reset delay timing signal, for receiving said power-up signal, and for generating a power-up reset signal having a leading edge responsive to said first portion of said received power-up signal and having a trailing edge responsive to a second portion of said received reset delay timing signal.

20. A power-up reset signal generator as recited in claim 19, wherein said reset delay timer means further receives a clock signal comprising a plurality of clock pulses and generates said reset delay timing signal in response to a selected number of said plurality of clock pulses corresponding to said selected time interval.

21. A power-up reset signal generator as recited in claim 19, wherein said reset delay timer means comprises a counter.

22. A power-up reset signal generator as recited in claim 20, wherein said reset delay timer means comprises a presettable counter.

23. A power-up reset signal generator as recited in claim 19, wherein said reset generator means comprises a plurality of logic gates interconnected to receive said reset delay timing signal, receive said power-up signal and generate said power-up reset signal.

24. A power-up reset signal generator as recited in claim 19, wherein said reset generator means generates said power-up reset signal substantially in accordance with the Boolean function:

$$R_{(t+1)} = (B + R_{(t)}) \cdot \overline{T}$$

where:
- $R_{(t)}$ = present state of said power-up reset signal
- $R_{(t+1)}$ = next state of said power-up reset signal
- B = said received power-up signal
- T = said reset delay timing signal.

25. A power-up reset signal generator for generating a power-up reset signal in response to a power-up signal representing a power-up condition, wherein said power-up reset signal selectively terminates after a selected time interval subsequent to initiation of said power-up condition, said power-up reset signal generator comprising:

gating means for receiving a gating signal, for receiving a power-up signal representing a power-up condition, and for selectively gating said received power-up signal in accordance with said received gating signal;

reset delay timer means connected to said gating means for receiving said selectively gated power-up signal and for generating a reset delay timing signal in response to and at a selected time interval after a first portion of said received, selectively gated power-up signal; and reset generator means connected to said reset delay timer means for receiving said reset delay timing signal, for receiving said power-up signal, for receiving said gating signal, and for generating a power-up reset signal, wherein said power-up reset signal includes a leading edge responsive to said received gating signal and said first portion of said received power-up signal, and further includes a trailing edge responsive to said received gating signal and a second portion of said received reset delay timing signal.

26. A power-up reset signal generator as recited in claim 25, wherein said reset delay timer means further receives a clock signal comprising a plurality of clock pulses and selectively generates said reset delay timing signal in response to a selected number of said plurality of clock pulses corresponding to said selected time interval.

27. A power-up reset signal generator as recited in claim 25, wherein said reset delay timer means comprises a counter.

28. A power-up reset signal generator as recited in claim 26, wherein said reset delay timer means comprises a presettable counter.

29. A power-up reset signal generator as recited in claim 25, wherein said reset generator means comprises a plurality of logic gates interconnected to receive said reset delay timing signal, receive said power-up signal, receive said gating signal, and generate said power-up reset signal.

30. A power-up reset signal generator as recited in claim 25, wherein said reset generator means generates said power-up reset signal substantially in accordance with the Boolean function:

$$R_{(t+1)} = (B + R_{(t)} \cdot G) \cdot \overline{T}$$

where:
- $R_{(t)}$ = present state of said power-up reset signal
- $R_{(t+1)}$ = next state of said power-up reset signal
- B = said received power-up signal
- T = said reset delay timing signal
- G = said received gating signal.

31. A power-up reset signal generation method for generating a power-up reset signal in response to a power-up signal representing a power-up condition, wherein said power-up reset signal is terminated after a selected time interval subsequent to initiation of said power-up condition, said power-up reset signal generation method comprising the steps of:

receiving a power-up signal representing a power-up condition;

generating a reset delay timing signal in response to and at a selected time interval after a first portion of said received power-up signal; and generating a power-up reset signal having a leading edge responsive to said first portion of said received power-up signal and having a trailing edge responsive to a second portion of said reset delay timing signal.

32. A power-up reset signal generation method as recited in claim 31, further comprising the steps of receiving a clock signal having a plurality of clock pulses and generating said reset delay timing signal in response to a selected number of said plurality of clock pulses corresponding to said selected time interval.

33. A power-up reset signal generation method as recited in claim 31, wherein said step of generating said power-up reset signal is substantially in accordance with the Boolean function:

$$R_{(t+1)} = (B + R_{(t)}) \cdot \overline{T}$$

where:
- $R_{(t)}$ = present state of said power-up reset signal
- $R_{(t+1)}$ = next state of said power-up reset signal
- B = said received power-up signal
- T = said reset delay timing signal.

34. A power-up reset signal generation method for generating a power-up reset signal in response to a power-up signal representing a power-up condition, wherein said power-up reset signal is selectively terminated after a selected time interval subsequent to initiation of said power-up condition, said power-up reset signal generation method comprising the steps of:

receiving a power-up signal representing a power-up condition;

receiving a gating signal;

selectively gating said received power-up signal in accordance with said received gating signal;

generating a reset delay timing signal in response to and at a selected time interval after a first portion of said selectively gated power-up signal; and generating a power-up reset signal having a leading edge responsive to said received gating signal and said first portion of said received power-up signal, and further having a trailing edge responsive to said received gating signal and a second portion of said reset delay timing signal.

35. A power-up reset signal generation method as recited in claim 34, further comprising the steps of receiving a clock signal having a plurality of clock pulses and selectively generating said reset delay timing signal in response to a selected number of said plurality of clock pulses corresponding to said selected time interval.

36. A power-up reset signal generation method as recited in claim 34, wherein said step of generating said power-up reset signal is substantially in accordance with the Boolean function:

$$R_{(t+1)} = (B + R_{(t)} \cdot G) \cdot \overline{T}$$

where:

$R_{(t)}$ = present state of said power-up reset signal
$R_{(t+1)}$ = next state of said power-up reset signal
$B$ = said received power-up signal
$T$ = said reset delay timing signal
$G$ = said received gating signal.

* * * * *